(12) United States Patent
Nakamura

(10) Patent No.: US 7,726,145 B2
(45) Date of Patent: Jun. 1, 2010

(54) TEMPERATURE CONTROL UNIT FOR ELECTRONIC COMPONENT AND HANDLER APPARATUS

(75) Inventor: Satoshi Nakamura, Matsumoto (JP)

(73) Assignee: Seiko Epson Corporation (JP)

( * ) Notice: Subject to any disclaimer, the term of this patent is extended or adjusted under 35 U.S.C. 154(b) by 936 days.

(21) Appl. No.: 11/518,613

(22) Filed: Sep. 8, 2006

(65) Prior Publication Data

US 2007/0058350 A1 Mar. 15, 2007

(30) Foreign Application Priority Data

Sep. 9, 2005 (JP) ............................. 2005-261591

(51) Int. Cl.
 *F25D 23/12* (2006.01)
 *H05K 7/20* (2006.01)
 *H01L 23/34* (2006.01)
(52) U.S. Cl. ...................... 62/259.2; 361/711; 361/717; 361/722; 257/715; 257/717
(58) Field of Classification Search ................ 62/259.2; 361/704, 707, 709, 711, 717, 718, 722; 257/712, 257/714, 715, 717
See application file for complete search history.

(56) References Cited

U.S. PATENT DOCUMENTS

| | | | | |
|---|---|---|---|---|
| 5,345,107 A | * | 9/1994 | Daikoku et al. | ............. 257/717 |
| 6,345,665 B1 | * | 2/2002 | Schulz-Harder | ........... 165/80.4 |
| 2004/0212080 A1 | * | 10/2004 | Chen et al. | ................... 257/712 |
| 2004/0261439 A1 | * | 12/2004 | Wayburn et al. | ........... 62/259.2 |
| 2005/0231919 A1 | * | 10/2005 | Ujike et al. | ................. 361/719 |

FOREIGN PATENT DOCUMENTS

| | | |
|---|---|---|
| JP | 08-170859 | 7/1996 |
| JP | 2001-004718 | 1/2001 |
| JP | 2001-526837 | 12/2001 |
| JP | 2002-520622 | 7/2002 |
| JP | 2004-527764 | 9/2004 |
| JP | 2005-055330 | 3/2005 |
| WO | WO 98/46059 | 10/1998 |
| WO | WO 00/04396 | 1/2000 |
| WO | WO 02/097342 | 12/2002 |

* cited by examiner

*Primary Examiner*—Marc E Norman
(74) *Attorney, Agent, or Firm*—Harness, Dickey & Pierce, P.L.C.

(57) ABSTRACT

A temperature control unit for an electronic component and a handler apparatus, which are excellent in responsibility during cooling and heating, is obtained. The temperature control unit for an electronic component includes a cooling cycle device having a refrigerant passage circulating through a compressor, a condenser, an expander, and an evaporator; a thermally conductive block having an outer surface capable of coming in contact with the electronic component that is an object to be temperature-controlled, where an inner surface corresponding to the outer surface is placed opposite to the outer surface so as to be brought in contact with or apart from the evaporator; at least one first heater for heating the thermally conductive block; and a compressed air feeding circuit for feeding compressed air between facing surfaces of the evaporator and the thermally conductive block to part them.

13 Claims, 4 Drawing Sheets

TEMPERATURE CONTROL UNIT FOR ELECTRONIC COMPONENT AND HANDLER APPARATUS

The entire disclosure of Japanese Patent Application No. 2005-261591, filed Sep. 9, 2005, is expressly incorporated by reference herein.

BACKGROUND

1. Field of the Invention

The present invention relates to a temperature control unit for an electronic component which is used for characteristic inspection of the electronic component, and a handler apparatus including the temperature control unit.

2. Description of the Related Art

In characteristic inspection of the electronic component such as an IC, there is a temperature loading test where the electronic component is inspected while being maintained at a predetermined temperature. In the temperature loading test, it is required to inspect the electronic component under a correct temperature loading while compensating the temperature change due to self-heating of the electronic component. Especially, in recent years, as represented by a CPU of a personal computer, there is a tendency that as the electronic component becomes faster, more highly integrated and miniaturized, an amount of heat generation in the electronic component is increased. Therefore, a high level temperature controlling technology is required during inspecting the electronic component. Consequently, heretofore, various kinds of temperature controlling technologies have been developed (for example, Patent documents 1 to 3).

[Documents 1] JP-T-2001-526837
[Documents 2] JP-T-2002-520622
[Documents 3] JP-T-2004-527764

In a method as in Patent document 1 or Patent document 2, where a cooling liquid is circulated, a liquid cooling device (chiller) with a large tank is required to make the cooling liquid circulate, thereby, requiring much time for cooling the cooling liquid in the tank before the operation for cooling the electronic component.

Moreover, in a cooling system as in Patent document 3, including a compressor and a condenser, responsibility of heating during switching from cooling to heating was not always satisfactory.

Moreover, as for such a kind of conventional temperature control unit, there was a problem in that dew condensation occurred at a pipe of a movable area due to cooling.

Further, in a measuring hand of a handler apparatus integrally a having a function for transferring the electronic component and a function for cooling the electronic component being measured, there was also a problem in that a suction pad for sucking the electronic component may sucks in a thermally conductive liquid coated on the upper surface of the electronic component in order to improve thermal conductivity thereof.

SUMMARY

The present invention is performed in view of the above-mentioned problems, and the object of the present invention is to obtain a temperature control unit and a handler apparatus for an electronic component, which are excellent in responsibility during performing both of cooling and heating. Moreover, the object of the present invention is to obtain a temperature control unit and a handler apparatus, where dew condensation to a pipe of a movable part due to cooling is prevented. Further, the object of the present invention is also to obtain a temperature control unit and a handler apparatus, including a suction pad for vacuum-sucking the electronic component that is an object to be temperature-controlled, where the suction pad can suck the electronic component without sucking in the thermally conductive liquid discharged on the upper surface of the electronic component.

The temperature control unit for an electronic component according to the present invention includes a cooling cycle device having a refrigerant circuit that circulates through a compressor, a condenser, and an expander; a thermally conductive block having an outer surface capable of coming in contact with the electronic component to be temperature-controlled, where an inner surface corresponding to the outer surface is placed opposite the evaporator so as to be brought in contact with or apart from the evaporator; at least one first heater for heating the thermally conductive block; and a compressed air feeding circuit for feeding a compressed air between facing surfaces of the evaporator and the thermally conductive block, to part them.

According to the temperature control unit, since the electronic component can be cooled in a state where the thermally conductive block is in contact with the evaporator, and can be heated in a state where the evaporator and the thermally conductive block are separated each other by feeding compression air between them, the responsibility improves during both of cooling and heating.

In the above mentioned temperature control unit, it is preferable for the compressed air feeding circuit to include a flow controller for controlling feeding of the compressed air passing through the circuit. As for the flow controller, it is preferable to have both functions to open/close the flow passage and to adjust the flow rate. By controlling the feed rate of the compressed air using the flow controller, the separation distance between the evaporator and the thermally conductive block can be adjusted.

Moreover, it is preferable for the above compressed air feeding circuit to include a device for drying the compressed air passing through the circuit.

By eliminating an O-ring or a sealing between the evaporator and the thermally conductive block, and feeding a dry compression air between them, the dry air leaks upward from a small gap between the evaporator and the thermally conductive block, thus, enabling to fill the surroundings of the evaporator with the dry air. Further, by controlling the flow controller so that the flow rate becomes larger than the leak rate or smaller than the leak rate, the separation distance between the evaporator and the thermally conductive block can be adjusted. In this manner, by feeding the dry air between the evaporator and the thermally conductive block, thus separating them, the evaporator and the heater can be thermally isolated, resulting in further improvement of responsibility during heating. Moreover, by feeding the dry air, occurrence of dew condensation of the evaporator that leads to a low temperature, can be prevented.

Further, it is preferable to provide a thermally conductive liquid feeding circuit for feeding the thermally conductive liquid between the facing surfaces of the evaporator and the thermally conductive block. In addition, it is also possible to feed the thermally conductive liquid, in conjunction with compression, by connecting the thermally conductive liquid feeding circuit to the compressed air feeding circuit. During cooling, basically, the evaporator and the thermally conductive block are brought into contact with each other, however, by further intervening the thermally conductive liquid between them, a close contact property between them improves and cooling efficiency between the evaporator and the electronic component during cooling improves. Of course, in place of providing the thermally conductive liquid circuit, it is possible to encapsulate a liquid, which hardly degrades its thermal conductivity (for example, a silicone oil, polyphenyl ether, or perfluoro alkyl polyether), previously when the temperature control unit is assembled.

Moreover, it is preferable that the thermally conductive block has a shape surrounding the evaporator, the side wall of the thermally conductive block extending from the surrounding of the outer surface capable of coming in contact with the electronic component is placed via a gap with respect to the evaporator, and the gap and the compressed air feeding circuit are in communication with each other. In this manner, when the thermally conductive block is heated, the thermally conductive block can decrease the effect of the cold of the evaporator, thus resulting in improvement of responsibility of heating.

Moreover, it is preferable for the first heater to be placed on the sidewall of the thermally conductive block. Consequently, since thermal conduction between the evaporator and the electronic component during cooling, is performed without involving the first heater, the responsibility of cooling the electronic component improves without reduction of thermal conductivity due to the first heater.

Moreover, it is preferable to include a second heater for heating a pipe returning from the evaporator to the compressor. In addition, when the distance between the evaporator and the second heater, is short, a heat insulator should be placed to a piping area between the evaporator and the second heater. By these arrangements, dew condensation during cooling, of a movable pipe that moves together with the evaporator, can be prevented.

Moreover, it is preferable to include an overheat protector for preventing that the second heater becomes to a temperature higher than a predetermined temperature. This prevents overheating of the second heater.

Further, it is preferable to include at least one first temperature sensor for detecting a temperature of the thermally conductive block, and a controller for controlling the operations of the first heater and the compressed air feeding circuit based on a detected valued of the first temperature sensor. This enables to perform heating control of the thermally conductive block automatically in high responsibility. In addition, if it is required to watch the temperature of the thermally conductive block at multiple points, a plurality of the first temperature sensors and the first heaters should be included, respectively.

Moreover, it is preferable to include a second temperature sensor for detecting a temperature of the second heater, and a controller for controlling the operation of the second heater based on a detected value of the second temperature sensor. This enables to control of prevention of dew condensation of a pipe at the refrigerant recovery side, automatically. In addition, as for the controller, a controller for controlling the operation of the first heater may be used.

Moreover, in the above temperature control unit, at least one suction pad for vacuum-sucking the electronic component to pin it against the thermally conductive block may be included at the outer periphery of the thermally conductive block. If such a suction pad is included, since the electronic component can be intimately hold to the thermally conductive block, thermal conduction efficiency between them improves and the electronic component can be transferred.

In addition, it is preferable that the suction pad is constituted so as to be extensible so that, when sucking is not performed, the suction pad is in an extended state, and a tip thereof is located at a position extruding from the surface of the thermally conductive block, to come in contact with the electronic component, and when sucking is performed, the suction pad changes to be in a shrinked state. In this manner, even when the thermally conductive liquid improving thermal conductivity is dropped between the electronic component and the thermally conductive block, there is no possibility that the liquid is sucked in the suction pad.

Further, it is preferable to include a thermally conductive liquid feeder for feeding an insulating thermally conductive liquid to the upper surface of the electronic component to be pinned against the thermally conductive block. By intervention of the thermally conductive liquid between the thermally conductive block and the electronic component using the liquid feeder, it is possible to improve the efficiency of thermal conduction between them, during cooling.

The handler apparatus of the present invention is a handler apparatus including a robot hand for pressing the electronic component against a tester, further including any one of the temperature control units described above, and the electronic component cooling part of the unit including an evaporator and a thermally conductive block is placed on the robot hand.

Using the handler apparatus, it is possible to obtain a temperature control unit and a handler apparatus, excellent in responsibility during performing both of cooling and heating. Moreover, it is possible to obtain a temperature control unit and a handler apparatus where dew condensation due to cooling with respect to a pipe of a movable part is prevented. Further, in a temperature control unit including a suction pad for vacuum-suctioning the electronic component to be temperature-controlled, it is possible to solve a problem in that the suction pad suctions the thermally conductive liquid discharged on the upper surface of the electronic component.

DESCRIPTION OF THE PREFERRED EMBODIMENTS

First Embodiment

Figure 1:
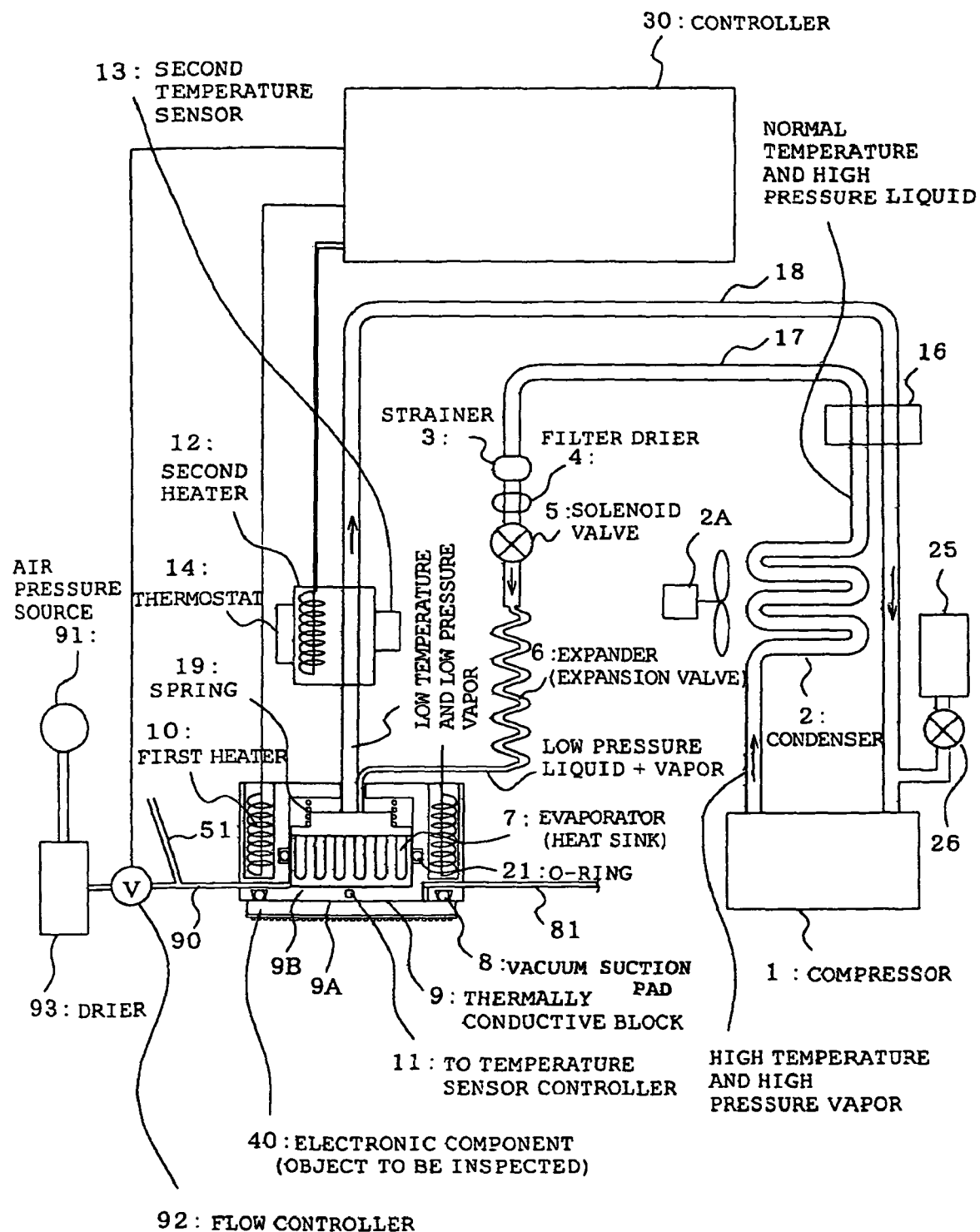
FIG. 1 is an entire schematic view of a temperature control unit for an electronic component according to a first embodiment of the present invention.
Figure 2A:
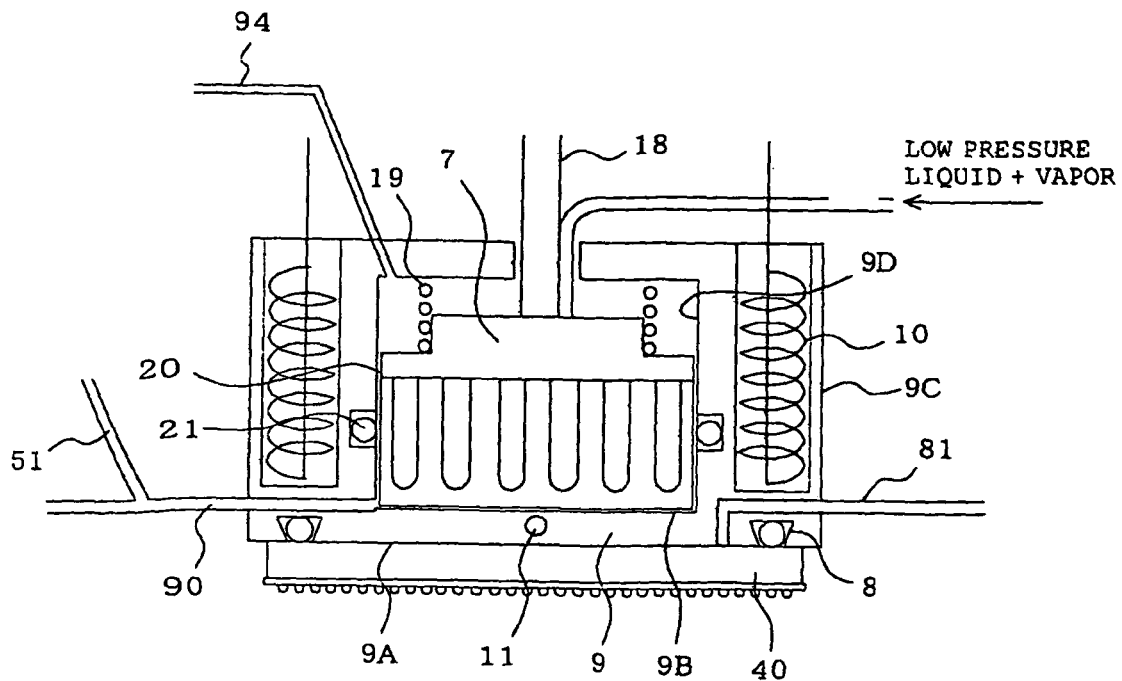
FIG. 2A is a sectional view of an electronic component cooling part constituting the temperature control unit in FIG. 1.
Figure 2B:
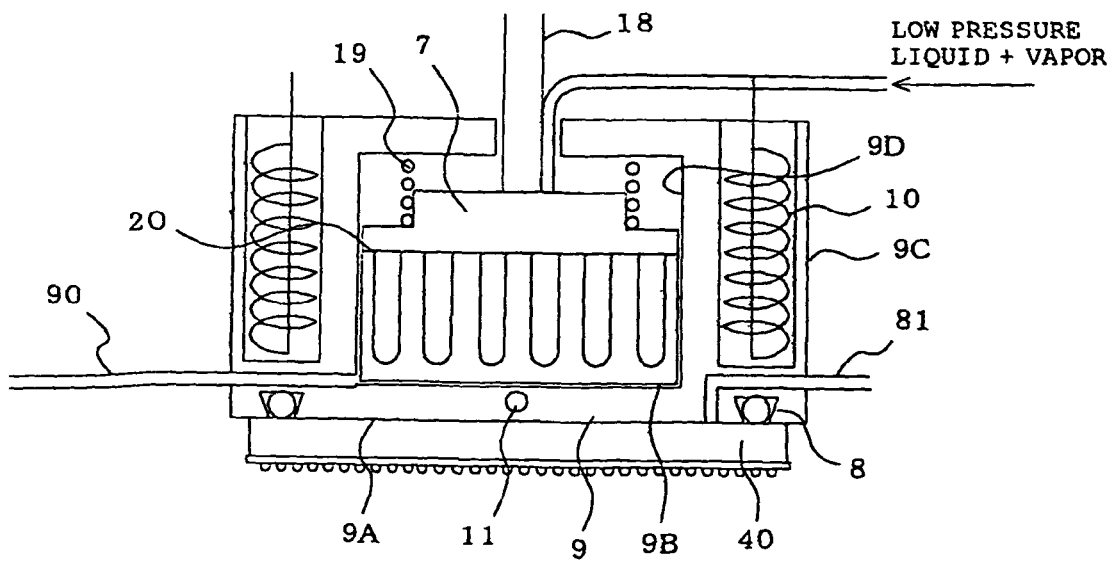
FIG. 2B is a sectional view of a modified electronic component cooling part.

FIG. 1 is an entire schematic view of a temperature control unit for an electronic component according to a first embodiment of the present invention. Moreover, FIG. 2 is a sectional view of an electronic component cooling part (the below described part composed of an evaporator, a thermally conductive block, and suction pad, however, in some cases there is no suction pad) of the temperature control unit in FIG. 1. The main difference between FIG. 2A and FIG. 2B, is presence or non-presence of an o-ring between the evaporator and the thermally conductive block.

The temperature control unit includes a circulation circuit of a refrigerant where a compressor 1, condenser 2, an expander (for example, an expansion valve) 6, and an evaporator 7 are connected by pipes 17 and 18, and a cooling cycle system is configured by the refrigerant circulating circuit. Among those, the evaporator 7 is directly responsible for a temperature control of the electronic component 40 as a heat sink. In the evaporator 7, a thermally conductive block 9 having an outer surface, in this example an outer bottom surface 9A in contact with the electronic component 40, is fitted to the evaporator 7 so as to be relatively movable with aid of an elastic body such as a spring 19. In the thermally conductive block 9, a first heater 10 for heating thereof, and a first temperature sensor 11 as a temperature sensor for detecting a temperature on the surface of the thermally conductive block 9 or the electronic component 40, are incorporated. The first temperature sensor 11 is connected to a controller (for example, a programmable controller) 30, and the controller 30 controls the operation of the first heater 10 depending on a detected temperature of the first temperature sensor 11.

In addition, the electronic component 40 is brought into contact with the evaporator 7 not directly but via the thermally conductive block 9. This makes it possible to perform control always under a good condition of thermal conductivity between the evaporator 7 and the electronic component 40 regardless of the type of the electronic component, by using a replaced thermally conductive block 9 corresponding to any one of electronic components having different shapes to be controlled.

The thermally conductive block 9 is made of a metal with good thermal conductivity (for example, copper) and has an outer bottom surface 9A which is able to come in contact with the electronic component 40. An inner bottom surface 9B corresponding to the outer bottom surface 9A is disposed opposite to the evaporator 7, so as to be able to come in contact (preferably close contact) with or separate from the evaporator 7 with aid of a spring 19. Moreover, a compressed air feeding circuit 90 for feeding a compressed air to separate them is connected to a gap between facing surfaces of the evaporator 7 and the thermally conductive block 9. The compressed air feeding circuit 90 includes an air pressure source 91 that is a supply source of the compressed air, and a flow controller (for example, a compressed air feeding valve) 92 for controlling air feeding from the air pressure source 91 to the evaporator 7. Further, in addition to them, it is preferable for the compressed air feeding circuit 90 to include a device for drying the compressed air (for example, a drier) 93.

In addition, the thermally conductive block 9 has a shape surrounding the evaporator 7, for example, a box shape shown in FIG. 2, and an aspect where the evaporator 7, which is fitted in and hold by the thermally conductive block 9 so as to be relatively movable with aid of the spring 19, is contained in the box shaped block. In this case, it is preferable to dispose the side wall of the thermally conductive block 9 extending from the surrounding of the outer bottom surface 9A capable of coming into contact with the electronic component, oppositely to the evaporator 7 with intervention of a small gap, and cause the compression air feeding circuit 90 to be in communication with the gap 20. Moreover, in this case, it is also preferable to place the first heater 10 on the side wall area of the thermally conductive block 9, so that the first heater 10 does not intervene on the bottom area of the thermally conductive block 9, located between the evaporator 7 and the electronic component 40. Where, the outer sidewall surface and the inner sidewall surface of the thermally conductive block 9 are designated by 9C and 9D, respectively.

As for the first heater 10, an alumina heater, an aluminum nitride heater, a silicon nitride heater, a silicon carbide heater, a boron nitride heater, or the like can be employed.

Moreover, the first temperature sensor 11 is not necessarily required. The reason is because, in some cases the electronic component 40 itself includes a equivalent of the temperature sensor, thus, in the case, it is possible to control the operation of the first heater 10 by feeding back a detected value of the equivalent of the temperature sensor of the electronic component 40 to the controller 30.

It is preferable that the evaporator 7 further includes at least one, preferably a plurality of suction pads (vacuum suction pad) 8 at the outer periphery of the thermally conductive block 9, as a means for taking up the electronic component 40 from a tray etc. the electronic component 40 to transfer it and pressing it against the thermally conductive block 9. The suction pad 8 is constituted by a flexible pad whose one end communicates with a vacuuming circuit 81 being in communication with a vacuum source, and the other end (tip) is opened so as to be able to vacuum-suck the electronic component 40.

Further, a hole or a groove is provided in the thermally conductive block 9, and in the hole or the groove, a temperature sensor (such as a platinum resistive element) is closely fixed using a thermally conductive material (such as a thermosetting resin mixed with a material with high thermal conductivity). In this manner, unstability of the contact thermal resistance between the thermally conductive block 9 and the first temperature sensor 11 is dissolved, resulting in great improvement in the accuracy of the measured temperature. Moreover, this contributes to prevent the breakage of the temperature sensor 11, because, even when the electronic component 40 is applied with a force to be pressed on an inspection socket, the thermally conductive material becomes a buffer material, thereby, the first temperature sensor 11 is not applied with a large force.

Moreover, when the electronic component 40 is a multi-core type, and has a plurality of heating points, in order to watch the temperature of the electronic component 40 at its plurality of points, it is preferable to include a plurality of first temperature sensors and first heaters 10, respectively. Since, in a high speed and highly integrated CPU etc., heat density is very high, thermal gradient occurs on the surface of the electronic component 40. Consequently, by dividing the heating area of the electronic component 40 into blocks, and controlling the temperature of the electronic component 40 at each block, the thermal gradient can be reduced and a problem in that the electronic component 40 has a high temperature locally, thereby, to be broken, can be solved.

It is possible to include a strainer 3, a filter drier 4, a solenoid valve 5 and the like, in a pipe 17 from the compressor 1 to the evaporator through the condenser 2 and expander 6. The strainer 3 has a function to absorb the fluctuation of refrigerant quantity in the evaporator 7 due to load fluctuation. The filter drier 4 contains a kind of desiccant (silica gel, Sovabead, molecular sieve, or the like) for removing moisture in the refrigerant, and in the case of a cooling cycle system using a refrigerant such as chlorofluorocarbon, that does not dissolve water, it is preferable to include the filter drier 4. The solenoid valve 5 has a function to open and close the refrigerant feeding passage through which the refrigerant directs toward the evaporator 7.

Meanwhile, in a pipe 18 at the side of refrigerant recovery, a second heater 12 such as a nichrome wire heater is included. It is preferable for the second heater 12 to incorporate a second temperature sensor 13 for detecting the temperature of the second heater 12. The second temperature sensor 13 is connected to the controller 30, and the controller 30 controls the operation of the second heater 12 depending on a detected temperature of the second temperature sensor 13. Moreover, it is preferable to include a thermostat or a thermal fuse as an overheat protector for protecting the second heater 12 at a predetermined temperature or more. In this example, a thermostat 14 is placed in a heating circuit of the second heater 12. In addition, when the second heater 12 is included at a position near the evaporator 7, it is preferable to include a heat insulator at piping area between the second heater 12 and the evaporator 7.

Moreover, as shown in FIG. 2A, it is possible to include a dry air feeding circuit 94 connected to a space above an O-ring 21 between the evaporator 7 and the thermally conductive block 9, so that dew condensation of the evaporator 7 is prevented by feeding a dry air into the space from the dry air feeding circuit 94.

Further, when a refrigerant liquid, which cannot be evaporated in the evaporator 7, remains, it is possible to include an accumulator (not shown) in the pipe 18 at the refrigerant recovery side frontward the compressor 1. Moreover, it is possible to place a heat exchanger 16 between the pipe 17 at the refrigerant feeding side and the pipe 18 at the refrigerant recovery side so as to perform heat exchange between the pipes. In addition, the symbol 2A in FIG. 1, designates a condenser fan for cooling the condenser 2.

Next, the action of the temperature control unit shown in FIG. 1, will be described. Cooling of the electronic component 40 is performed using the cooling cycle system in FIG. 1. In other words, the refrigerant that came out from the compressor 1 and was condensed into a liquid in a state of a normal temperature and a high pressure, by the condenser 2, is caused to be a fluid that is a mixture of a liquid and a gas under a low pressure by the expander 6, and is carried to the evaporator 7. By evaporation of the fluid in the evaporator 7, heat is robbed from the electronic component 40 pressed against the thermally conductive block 9, thus, the electronic component 40 is cooled. At this time, the evaporator 7 and the inner surface 9B of the thermally conductive block 9, are in a state of close contact by a repulsive force of the spring 19. However, for more close contact between the evaporator 7 and the thermally conductive block 9, it is possible to feed the thermally conductive liquid between them from the thermally conductive liquid feeding circuit 51 etc. in advance. As for the thermally conductive liquid in this case, a liquid such as a thermally conductive grease, a thermosetting resin, or a silicone oil, which does not vaporize at a temperature less than 200° C., can be used.

Meanwhile, when the temperature of the electronic component 40 becomes too low, or a high temperature test is performed, the controller 30 acts to a flow controller 92 to introduce the compressed air between the evaporator 7 and the inner bottom surface 9B of the thermally conductive block 9, and by the pressure, the evaporator 7 and the thermally conductive block 9 are separated each other. At the same time, by operating the first heater 10, the thermally conductive block 9 is heated, thereby, the temperature of the electronic component 40 is increased. In this manner, by separating the evaporator 7 and the thermally conductive block 9, since the effect of the cold of the evaporator 7 on the thermally conductive block 9 is reduced, responsibility during heating the electronic component 40 improves.

Further, when the electronic component 40 is heated, in addition to the above, it is possible to set a solenoid valve 5 to be off so as to block feeding of the refrigerant to the evaporator 7.

In addition to this, when the temperature of the refrigerant becomes lower than the atmospheric temperature at the location of the evaporator 7 due to evaporation in the evaporator 7, the controller causes the second heater 12 to operate, thereby, the pipe 18 at the refrigerant recovery side, extending from the evaporator 7, is heated, resulting in prevention of dew condensation thereof. In addition, since the evaporator 7 does not lower its temperature in comparison with the pipe 18 at the refrigerant recovery side, due to the heat robbed from the electronic component 40, and since the heat insulator can be relatively easily mounted on the evaporator 7 itself, measures against dew condensation of the pipe 18 at the refrigerant recovery side is especially required in the temperature control unit.

With regard to heating for preventing the dew condensation of the pipe 18 at the refrigerant recovery side, since accuracy of temperature is not required, the control of the second heater 12 can be satisfactorily made by performing temperature control using the overheat protector such as a thermostat or a thermal fuse. However, it is possible to control the second heater 12 by the controller 30, by using a control similar to that of the first heater 10, in which the second temperature sensor 13 is used and its detected value is fed back to the controller 30.

Moreover, as shown in FIG. 2B, by eliminating the O-ring 21 between the evaporator 7 and the thermally conductive block 9, and feeding a dry compressed air between them, the dry air leaks upward through a small gap between the evaporator 7 and the thermally conductive block 9, thus, enabling to fill the surroundings of the evaporator 7 with the dry air. Further, by controlling the flow controller 92 so that the flow rate is made larger than the leak rate or smaller than the leak rate, the separation distance between the evaporator 7 and the thermally conductive block 9 can be adjusted. In this manner, by feeding the dry air between the evaporator 7 and the thermally conductive block 9, thus isolating them, the evaporator 7 and the first heater 10 can be thermally isolated, resulting in further improvement of responsibility during heating. Moreover, by feeding the dry air, occurrence of dew condensation of the evaporator 7 having a low temperature can be prevented.

Figure 3:
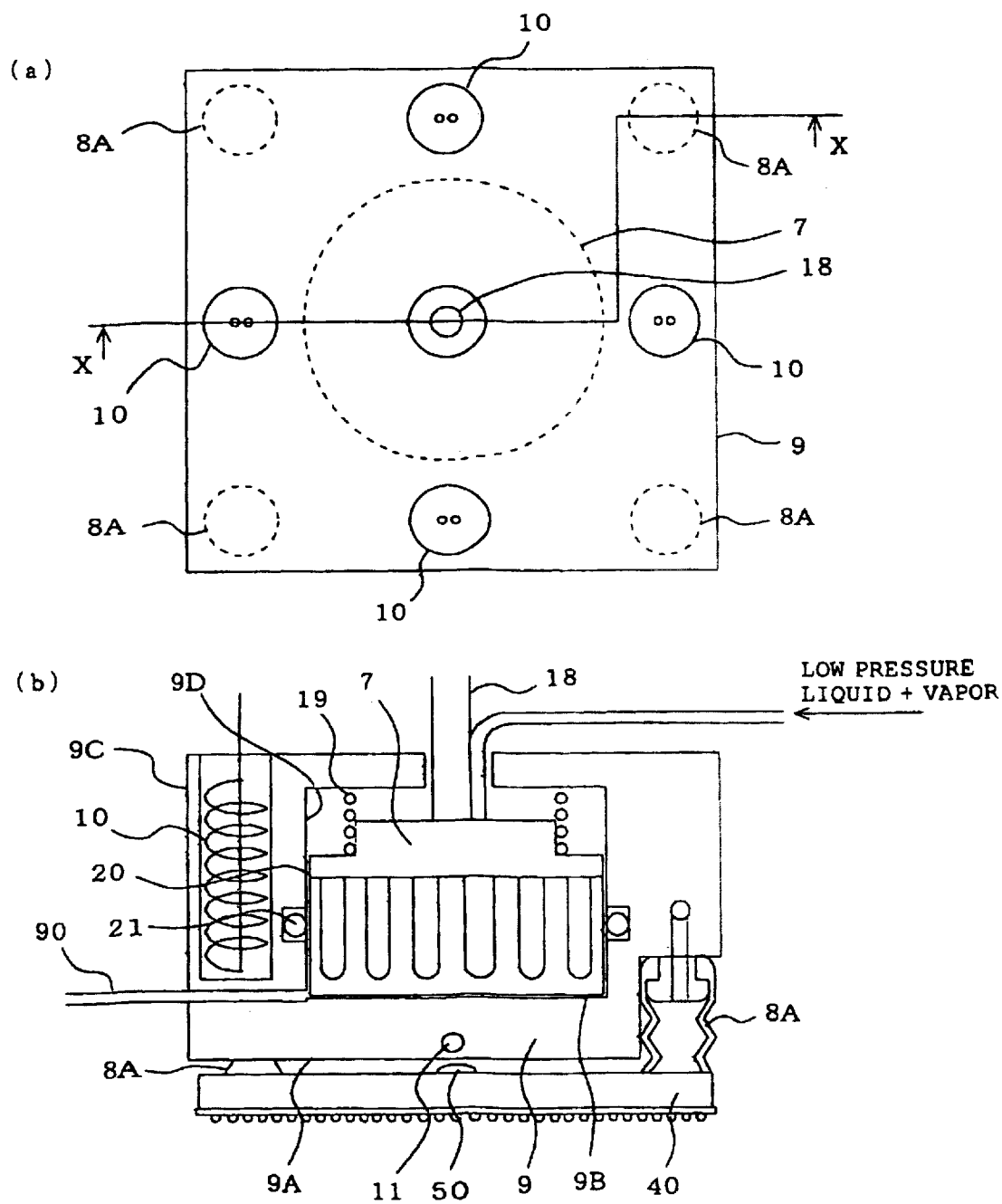
FIG. 3A is a plan view of another electronic component cooling part constituting the temperature control unit in FIG. 1.
FIG. 3B is a synthesized sectional view of the electronic component cooling part in X-X direction.

FIG. 3A shows a plan view of further another electronic component cooling part constituting the temperature control unit in FIG. 1, and FIG. 3B shows synthesized sectional view in X-X direction. The main difference between the electronic component cooling part in FIG. 3 and the electronic component cooling part in FIG. 2, is in structures of their suction pads. The suction pad 8A in FIG. 3, has the suctioning part constituted to have a bellows shape so as to be extensible. When suction is not performed, the suction pad is in an extended state so that a tip thereof is located at a position extruding from the surface of the thermally conductive block. When suction is performed, the suction pad 8A changes to be in a shrunken state.

In order to suck the electronic component 40 using the suction pad 8A, first, an electronic component cooling part containing the suction pad 8A, is made to descend to a position where the tip of the suction pad 8A come in contact with the upper surface of the electronic component 40. Then, when the tip of the suction pad 8A comes in contact with the upper surface of the electronic component 40, by performing vacuum-sucking in the suction pad 8A, the electronic component 40 is sucked by the suction pad 8A. Accompanied with the vacuum-sucking, the extensible suction pad 8A shrinks, sucking the electronic component 40. If the object is simply to transfer the electronic component 40, all that the suction pad 8A has to do is just to suck and hold the electronic component 40. However, when considering even to temperature-control the electronic component 40, it is preferable to suck the electronic component 40 so as to bring the electronic component 40 into close contact with the thermally conductive block 9.

And now, in order to enhance close contact property between the thermally conductive block 9 and the electronic component 40, thereby to improve thermal conductivity between them, in some cases, a thermally conductive liquid is coated between the thermally conductive block 9 and the electronic component 40. In this case, first, a liquid drop of the thermally conductive liquid 50 is dropped on the center of the upper surface of the electronic component 40, and then the suction pad 8A is brought into contact with the surroundings of the upper surface of the electronic component 40 with the liquid drop. After that, by performing vacuum-sucking in the suction pad 8A, the electronic component 40 is sucked by the suction pad 8A, thereby, the electronic component 40 is brought into close contact with the outer bottom surface 9A of the thermally conductive block 9. Due to the close contact between the electronic component 40 and the thermally conductive block 9, the liquid drop of the thermally conductive liquid 50 spreads on the surface in the close contact area. However, the suction pad 8A comes in contact with the electronic component 40 before the close contact. Therefore, even if performing vacuum-sucking in the suction pad 8A, there is no possibility that the thermally conductive liquid 50 is sucked in the suction pad 8A.

In addition, the thermally conductive liquid 50 used here is excellent in thermal conductivity, and has electrical insulating properties (electric resistance of $1 \times 10^{10} \Omega$ or more). As such a thermally conductive liquid, for example, a fluorine-based inert liquid is commercially available.

By this configuration, even if the thermally conductive liquid 50 is coated between the thermally conductive block 9 and the electronic component 40, there is no possibility that the thermally conductive liquid 50 is sucked. Moreover, by the series of sucking operations, since the liquid drop of the thermally conductive liquid 50 is spread on the surface of the electronic component as a thin film, another mechanism for forming a film is not required, and operational tact for causing the liquid to intervene on the surface of the electronic component as a thin film, can also be shortened. Furthermore, since the thermally conductive liquid 50 has electronic insulating properties, even if the thermally conductive liquid 50 is spilt or scattered from the upper surface of the electronic component, there is no possibility that the electronic component or a substrate at the side of a tester is caused to be short-circuited.

Further, the above-mentioned temperature control unit, preferably includes a refrigerant feeding source 25 connected with a refrigerant passage constituting the cooling cycle system, and a pressure-regulating valve 26 placed at a connection passage between the refrigerant passage and the refrigerant feeding source 25 as a pressure regulator. In this case, the pressure-regulating valve 26 is regulated so that, when the pressure of the refrigerant passage is decreased, the refrigerant is fed into the refrigerant passage from the refrigerant feeding source 25, and, when the pressure of the refrigerant passage is increased, the refrigerant is returned from the refrigerant passage to the refrigerant feeding source 25. In this manner, the pressure of the refrigerant in the refrigerant passage constituting the cooling cycle system is maintained at a constant level, thereby, permitting high accuracy temperature-control.

According to the temperature control unit thus constituted, during performing both of cooling and healing, excellent thermal responsibility and rapid temperature setting can be realized. Moreover, dew condensation on a movable pipe 18 due to cooling can be prevented. Further, in such a temperature control unit having a suction pad 8A for vacuum-sucking the electronic component 40 to be temperature-controlled, the electronic component can be sucked and hold, without sucking in the thermally conductive liquid discharged on the upper surface of the electronic component by the sucking pad 8A.

As above, the temperature control unit according to the present invention has been described following to an embodiment. However, the temperature control unit according to the present invention can be modified as follows. In other words, in the above-mentioned embodiment, although the first heater 10 and the second heater 12 are controlled by the same controller 30, they may be controlled by separate controllers. Moreover, the solenoid valve 5, the pressure-regulating valve 26, and the flow controller 92 which open and close the passage and control flow rate, may be controlled by individually equipped controllers, respectively, or may be controlled by a single common controller. Moreover, the controls of the solenoid valve 5, the pressure-regulating valve 26, and the flow controller 92, may also be controlled by the controller 30 which controls the first heater 10 and the second heater 12.

Second Embodiment

Figure 4:
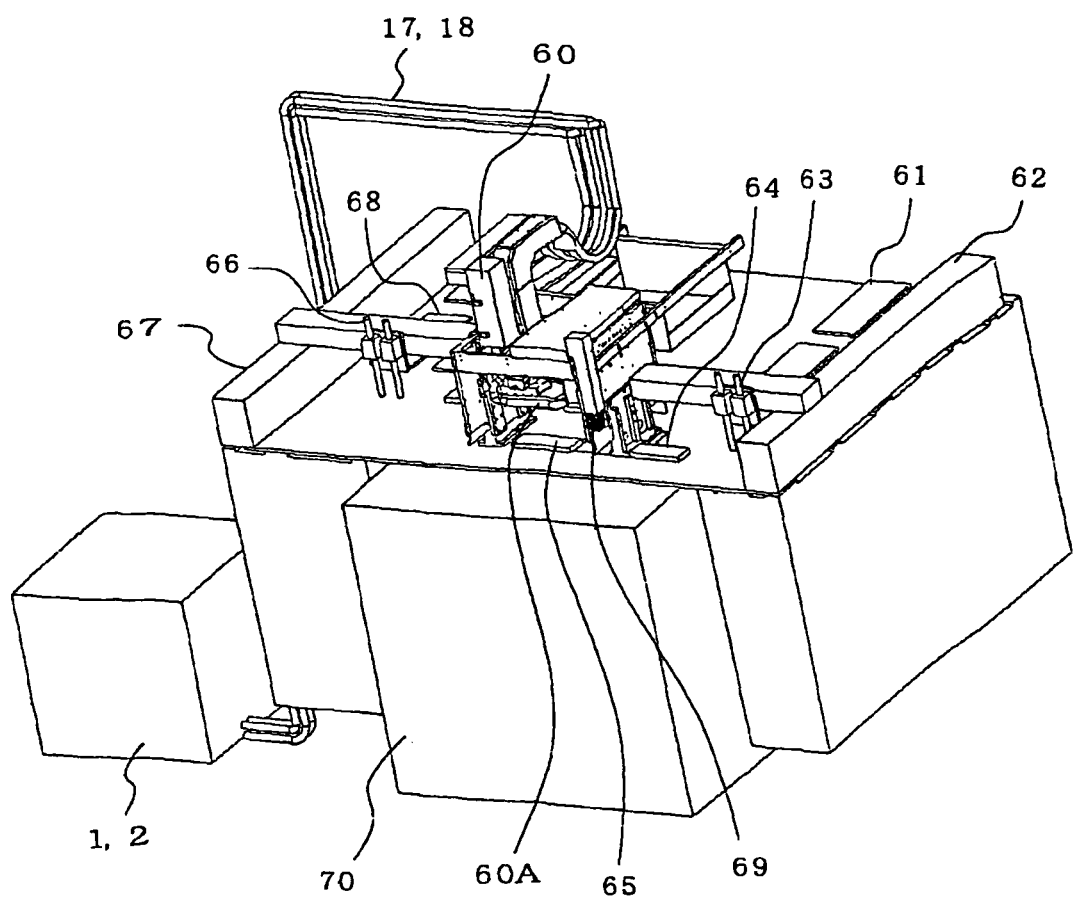
FIG. 4 is a schematic view of a handler apparatus according to a second embodiment of the present invention.

FIG. 4 is a schematic view of a handler apparatus according to a second embodiment of the present invention. The handler apparatus is a handling apparatus for an electronic component, which can perform characteristic inspection of the electronic component by maintaining the electronic component (including a device) at a predetermined temperature, and pressing it to a tester that is a separated body from the handler apparatus. The handling apparatus, in order to temperature-control the electronic component to be inspected, includes the temperature control unit described in the first embodiment. In addition, symbols 1, 2, 17 and 18 designated in FIG. 4, correspond to the same symbols in the first embodiment. Moreover, a measuring hand 60A constituting a measuring robot part 60 represented in FIG. 4, corresponds to the electronic component cooling part of the first embodiment. Hereinafter, using an IC (not shown) as the electronic component to be inspected, an inspection process of the IC using the handler apparatus of the second embodiment, will be described.

First, a feeding hand 63 of the feeding robot part 62 sucks and holds an IC by vacuum-sucking from a tray 61 for an un-inspected IC, and transfers it on a feeding shuttle 64. Followed by, the feeding shuttle 64 transfers the un-inspected IC placed thereon to a portion under a dispenser 19 that is a thermally conductive liquid feeding apparatus. Then, after the thermally conductive liquid 50 is discharged on the upper surface of the IC from the dispenser 69, the IC is further transferred to the measuring robot part 60. Next, the measuring robot part 60 sucks and holds the IC from the transferred feeding shuttle 64 using the measuring hand 60A, and transfers it to an inspection socket of a tester 70 (not shown). Where, the measuring robot part 60 presses the IC against the inspection socket to electrically connect it to the inspection socket, and characteristic inspection of electronic properties of the IC is performed. During inspecting the electronic properties of the IC, when the IC generates heat, the IC is cooled using an evaporator constituting the measuring hand 60A, and the cooling of the IC is controlled so to maintain the IC to be within a target temperature range. Moreover, during high temperature inspection, while introducing a compressed air between the evaporator and the thermally conductive block constituting the measuring hand 60A, and separating them, the heating of the IC is controlled using a first heater so as to maintain the IC to be within a target temperature range. When there is fluctuation of the heat generation of the IC, the cooling and the heating of the IC are controlled using the measuring hand 60A so as to maintain the IC to be within a target temperature range. After the inspection of the electronic properties is finished, the measuring robot part 60 sucks and holds the inspected IC from the inspection socket using the measuring hands 60A thereof, and transfers it on a recovery shuttle 65. The recovery shuttle 65 transfers the inspected IC from the measuring robot part 60 to a recovery robot part 66. Further, a signal of the results of the inspection of the electronic properties is received from the tester 70, and by the results, the recovery hand 67 of the recovery robot part 66 sucks and holds the IC from the recovery shuttle 65, and classifies the results and holds them in a tray 68 for inspected IC depending on the inspected results. By the above-mentioned process, the characteristic inspection of the IC is finished.

The handler apparatus of the second embodiment includes the temperature control unit described in First Embodiment, and the electronic component cooling part of the first embodiment is installed in the measuring hand, which presses the component to be inspected to the tester 70 or holds the component to be inspected to press it to the tester 70. Accordingly, effects corresponding to the first embodiment will also be obtained in this handler apparatus.

In other words, a handler apparatus, which is excellent in thermal responsibility in both cases of cooling and heating of the electronic component 40, can be obtained. Moreover, a handler apparatus, in which dew condensation of a pipe of movable area due to cooling is prevented, can be obtained. Further, when the suction pad 8A for vacuum-sucking the electronic component to be temperature-controlled is included, the suction pad 8A can suck the electronic component without sucking in the thermally conductive liquid discharged on the upper surface of the electronic component.

What is claimed is:

1. A temperature control unit for an electronic component comprising:
    a cooling cycle device having a refrigerant circuit that circulates through a compressor, a condenser, an expander, and an evaporator;
    a thermally conductive block having an outer surface capable of coming in contact with the electronic component to be temperature-controlled, and an inner surface corresponding to the outer surface placed opposite the evaporator so as to be brought in contact with or apart from the evaporator;
    at least one first heater mounted in the thermally conductive block, for heating the thermally conductive block;
    an air supply source;
    a compressed air feeding circuit for feeding compressed air from the air supply source to a gap between facing surfaces of the evaporator and the thermally conductive block to part them;
    a flow controller for controlling feeding of the compressed air passing through the compressed air feeding circuit;
    at least one first temperature sensor for detecting a temperature of the thermally conductive block; and
    a controller for controlling the operation of the first heater and the compressed air feeding circuit, based on a detected value of the first temperature sensor.

2. The temperature control unit for an electronic component according to claim 1, wherein the compressed air feeding circuit includes a device for drying the compressed air passing through the compressed air feeding circuit.

3. The temperature control unit for an electronic component according to claim 1, further comprising a thermally conductive liquid feeding circuit for feeding a thermally conductive liquid between facing surfaces of the evaporator and the thermally conductive block.

4. The temperature control unit for an electronic component according to claim 1, wherein the thermally conductive block has a shape surrounding the evaporator, its side wall extended from surroundings of the outer surface capable of coming in contact with the electronic component is placed via a gap with respect to the evaporator, and the gap and the compressed air feeding circuit are in communication with each other.

5. The temperature control unit for an electronic component according to claim 4, wherein the first heater is placed on the side wall of the thermally conductive block.

6. The temperature control unit for an electronic component according to claim 1, further comprising a second heater for heating a pipe returning from the evaporator to the compressor.

7. The temperature control unit for an electronic component according to claim 6, wherein the second heater includes an overheat protector for preventing that the second heater becomes to a temperature higher than a predetermined temperature.

8. The temperature control unit for an electronic component according to claim 6, further comprising a second temperature sensor for detecting a temperature of the second heater, and a controller for controlling the operation of the second heater, based on a detected value of the second temperature sensor.

9. The temperature control unit for an electronic component according to claim 1, further comprising at least one suction pad at an outer periphery of the thermally conductive block, for vacuum-sucking the electronic component to pin the electronic component against the thermally conductive block.

10. The temperature control unit for an electronic component according to claim 9, wherein the suction pad is constituted so as to be extensible so that, when sucking is not performed, the suction pad is in an extended state, and a tip thereof is located at a position extruding from a surface of the thermally conductive block to come in contact with the electronic component, and when sucking is performed, the suction pad changes to be in a shrinked state.

11. The temperature control unit for an electronic component according to claim 1, further comprising a thermally conductive liquid feeder for feeding an insulating thermally conductive liquid to an upper surface of the electronic component to be pinned against the thermally conductive block.

12. A handler apparatus comprising a robot hand for pressing an electronic component to a tester, wherein the handler apparatus further comprises the temperature control unit for an electronic component according to claim 1, and the electronic component cooling part of the unit including an evaporator and a thermally conductive block is installed in the robot hand.

13. A temperature control unit for an electronic component comprising:
    a cooling cycle device having a refrigerant circuit that circulates through a compressor, a condenser, an expander, and an evaporator;
    a thermally conductive block having an outer surface capable of coming in contact with the electronic component to be temperature-controlled, and an inner surface corresponding to the outer surface placed opposite the evaporator so as to be brought in contact with or apart from the evaporator;

at least one first heater mounted in the thermally conductive block, for heating the thermally conductive block;

an air supply source;

a compressed air feeding circuit for feeding compressed air from the air supply source to a gap between facing surfaces of the evaporator and the thermally conductive block to part them;

a flow controller for controlling feeding of the compressed air passing through the compressed air feeding circuit; and a controller for controlling the operation of the first heater and the compressed air feeding circuit, based on a detected value of the inside temperature of the electronic component.

* * * * *